US008948408B2

(12) United States Patent
Jeong et al.

(10) Patent No.: US 8,948,408 B2
(45) Date of Patent: Feb. 3, 2015

(54) ACTIVE NOISE CONTROL APPARATUS FOR INTAKE SYSTEM OF VEHICLE

(75) Inventors: Hoe Jo Jeong, Gunpo-si (KR); Ji Hoon Jeong, Anyang-si (KR); Hyun Ku Lee, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 368 days.

(21) Appl. No.: 13/367,067

(22) Filed: Feb. 6, 2012

(65) Prior Publication Data

US 2013/0121501 A1 May 16, 2013

(30) Foreign Application Priority Data

Nov. 14, 2011 (KR) ........................ 10-2011-0118022

(51) Int. Cl.
*H03B 29/00* (2006.01)
*G10K 11/16* (2006.01)
*G10K 11/178* (2006.01)
*F02M 35/12* (2006.01)

(52) U.S. Cl.
CPC ......... *G10K 11/1788* (2013.01); *F02M 35/125* (2013.01); *F02M 35/1294* (2013.01); *G10K 2210/1282* (2013.01)
USPC ......................................... 381/71.4; 381/71.5

(58) Field of Classification Search
CPC ................................ H03B 29/00; G10K 11/16
USPC ................................................ 381/71.1–71.5
See application file for complete search history.

(56) References Cited

U.S. PATENT DOCUMENTS

| | | | | |
|---|---|---|---|---|
| 5,176,114 | A | 1/1993 | Brackett | |
| 5,336,856 | A * | 8/1994 | Krider et al. | 181/206 |
| 5,414,230 | A * | 5/1995 | Nieuwendijk et al. | 181/206 |
| 6,758,304 | B1 * | 7/2004 | McLean | 181/206 |
| 6,898,289 | B2 * | 5/2005 | Vanderveen et al. | 381/71.4 |
| 2002/0034309 | A1 * | 3/2002 | McLean et al. | 381/71.4 |
| 2002/0071571 | A1 * | 6/2002 | Vanderveen et al. | 381/71.4 |
| 2004/0195040 | A1 * | 10/2004 | Vaishya et al. | 181/206 |
| 2007/0186895 | A1 * | 8/2007 | Ochi | 123/198 E |

FOREIGN PATENT DOCUMENTS

| | | | |
|---|---|---|---|
| JP | 8-270518 | A | 10/1996 |
| JP | 9-151817 | A | 6/1997 |
| JP | 9-209860 | A | 8/1997 |
| KR | 2003-0041318 | A | 5/2003 |

* cited by examiner

*Primary Examiner* — Disler Paul
(74) *Attorney, Agent, or Firm* — Morgan, Lewis & Bockius LLP

(57) ABSTRACT

An active noise control apparatus for an intake system of a vehicle may include a filter mounted on a portion of the intake system for blocking foreign materials; and a speaker assembly detachably installed at the portion to which the filter is mounted.

7 Claims, 7 Drawing Sheets

ACTIVE NOISE CONTROL APPARATUS FOR INTAKE SYSTEM OF VEHICLE

CROSS-REFERENCE TO RELATED APPLICATION

The present application claims priority to Korean Patent Application No. 10-2011-0118022 filed on Nov. 14, 2011, the entire contents of which is incorporated herein for all purposes by this reference.

BACKGROUND OF THE INVENTION

1. Field of the Invention

The present invention relates to an active noise control apparatus for an intake system of a vehicle. More particularly, the present invention relates to an active noise control apparatus for an intake system of a vehicle in which a speaker is installed at a specific location of the intake system of the vehicle, which makes it possible to actively attenuate engine noises discharged to the intake system and simultaneously tune the noises into a sound quality having particular characteristics.

2. Description of Related Art

In general, as a conventional method to attenuate and tune engine noises discharged into an intake system when driving a vehicle, there has been used a variety of passive noise control elements.

As an example of the passive noise control element, various methods might be mentioned: a method to control the capacity of an air cleaner, a method to install a resonator with a resonance-type or expansion-type structure at a specific portion of the intake system, a method to install a ¼ wavelength tube at an intake duct of the intake system, a method to adjust the length and cross-section area of the intake duct or the like.

Recently, an active noise control technology for the intake system has been applied instead of the method of tuning with the passive noise control element.

The active noise control (ANC) technology for the intake system is a technology that, after predicting or measuring the noises discharged from the engine, controls attenuation of the noises outputted from the engine and simultaneously embodies a sound quality having particular characteristics using an anti-noise with a reverse phase, which has advantages in noise removal and tuning of the sound quality compared with the conventional passive noise control element.

Referring to FIG. 9, the configuration of active noise control for the intake system includes a speaker 12 and a feedback microphone 14 which are disposed at specific locations of an intake system 10 connected to an engine, and an ANC controller 20 which receives an RPM signal from an engine ECU 16 and simultaneously applies a control signal to an amplifier 22 after receiving an error signal for compensating the sound of a pre-amplifier 18 which is designed to amplify the sound of the feedback microphone 14.

Accordingly, when the ANC controller 20 receives the RPM signal from the engine ECU 16 and simultaneously receives the error signal for compensating the sound of the pre-amplifier 18 to amplify the sound of the feedback microphone 14 and then provides a controlled sound-source signal which is calculated on the basis of the RPM signal and the error signal for compensating the sound to the amplifier 22, the controlled sound-source is transferred from the amplifier 22 to the speaker 12 and at the same time the controlled sound-source is outputted from the speaker 12 into the intake system 10, thereby attenuating and tuning the engine noises discharged into the intake system.

In such an active noise control technology for the intake system, the controlled sound-source for attenuating and tuning the engine noises is substantially outputted from the speaker, the mounting location and structure thereof act as a very important factor.

As an exemplary conventional art, U.S. Pat. No. 6,084,971 discloses a speaker mounting structure for an active noise control for an intake system characterized in which a speaker having a chamber at its rear end is mounted on the inlet portion of an intake duct, and an intake passage for an intake air is formed at the peripheral portion of the speaker.

However, the above patent has drawbacks in that since the speaker is installed at the inlet portion of the intake duct, which causes the structure of the inlet portion of the intake duct to be large in a circular shape including a space occupied by the speaker, there may arise interference issues or the like with the neighboring components when practically applying them to the vehicle. In addition, the speaker is mounted on the inlet portion of the intake duct, dust, water, snow or other foreign materials may be introduced into the inlet portion of the intake duct, which leads to contamination and corrosion of the speaker, finally lowering the performance of the speaker or causing the breakdown thereof.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing an active noise control apparatus for an intake system of a vehicle in which a speaker assembly capable of selecting the speaker size and blocking the foreign materials is separately manufactured and is detachably installed at a specific location of the intake system of the vehicle, so as to actively attenuate engine noises discharged into the intake system, simultaneously tune the noises into a sound quality having particular characteristics, prevent the foreign materials from penetrating towards the speaker, and make it possible to mount the speaker in a wide range depending upon kinds of vehicles and engines.

In an aspect of the present invention, an active noise control apparatus for an intake system of a vehicle may include a filter mounted on a portion of the intake system for blocking foreign materials, and a speaker assembly detachably installed at the portion to which the filter is mounted.

The speaker may include a speaker lower cover formed with a speaker mounting opening at an upper side surface thereof, and a speaker assembled at the speaker mounting opening of the speaker lower cover, wherein a peripheral portion of the speaker mounting opening is assembled on an installation opening formed at a side surface of the intake duct.

The filter is mounted in the installation opening.

An adapter having a mounting hole at the center thereof is assembled at the peripheral portion of the speaker mounting opening.

The speaker assembly may include a speaker lower cover formed with a speaker mounting opening at an upper end portion thereof, a speaker assembled at the speaker mounting opening of the speaker lower cover, a speaker upper cover coupled to the upper end portion of the speaker lower cover for covering the speaker mounting opening therein, and a connector tube integrally formed on an upper surface of the speaker upper cover, wherein an upper end portion of the connector tube is detachably assembled on an installation opening formed at a side surface of an intake duct in the intake system.

An adapter with a mounting hole at the center thereof is assembled at a peripheral portion of the speaker mounting opening.

The filter is disposed at the upper end portion of the connector tube.

In another aspect of the present invention, the speaker assembly may include a speaker mounted on an inner surface of an air cleaner cover in the intake system, and a speaker cover disposed at an outer surface of the air cleaner cover for covering a rear portion of the speaker.

The speaker is mounted on the inner surface of the air cleaner cover through a speaker mounting opening formed to the air cleaner cover.

In further another aspect of the present invention, an adapter having a mounting hole at the center thereof is further assembled to the speaker mounting opening between the speaker and the speaker cover.

Other aspects and exemplary embodiments of the invention are discussed infra.

According to the present invention, a speaker assembly for an active noise control apparatus for an intake system is separately provided and assembled at a specific portion of an intake duct, which makes it possible to install a speaker with different sizes and specifications in a wide range using an adapter.

Particularly, a filter for blocking the foreign materials is mounted before installation of the speaker assembly at a specific portion of an intake duct, so that introduction of dust, water, snow or other foreign materials may be blocked to prevent the contamination and corrosion of the speaker.

Further, since the speaker assembly is assembled at one side surface of the intake duct and not inside of the intake duct, it is possible to maintain the diameter of the inner air passage of the intake duct and to expect improvement of the engine output in an intake pressure aspect.

In addition, since the speaker assembly is integrally assembled with the air cleaner to make the inside of an air cleaner in a clean state, it is possible to mount only the speaker assembly excluding a filter.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
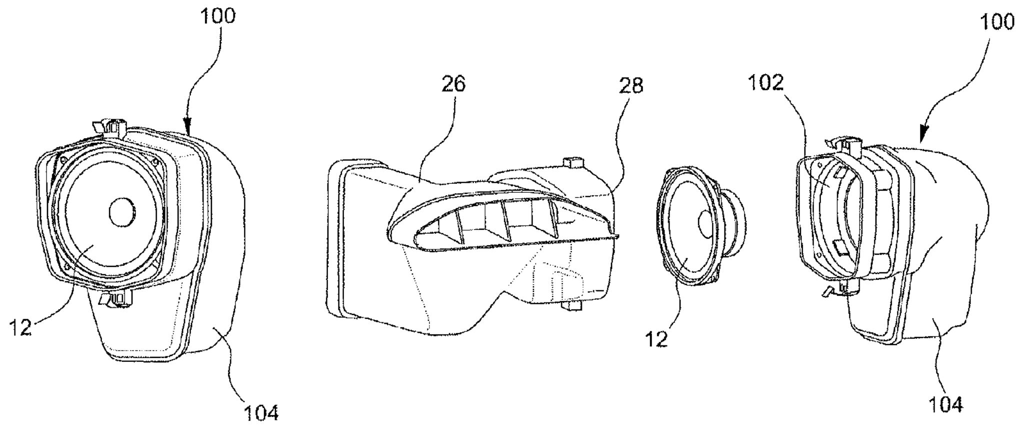
FIGS. 1 to 4 are perspective views illustrating assembling constructions of a speaker assembly of an active noise control apparatus for an intake system of a vehicle in accordance with one embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

The present invention has principal features in that a speaker for an active noise control for an intake system is assembled at a specific portion of an intake duct, which makes it possible to install a speaker with different sizes and specifications in a wide range using an adapter, and it can block the introduction of the foreign materials and further prevent the contamination and corrosion of the speaker by installing a filter for blocking the foreign materials at the portion of the intake system to which the speaker is mounted.

To this end, the filter is mounted before the speaker assembly is installed at a specific portion of the intake system, and the speaker assembly including the speaker is detachably assembled at a portion in the intake system to which the filter is mounted.

Here, an assembling construction of a speaker assembly of an active noise control apparatus for an intake system of a vehicle in accordance with one embodiment of the present invention will be described with reference to FIGS. 1 to 4 hereinafter.

A speaker assembly 100 in accordance with one embodiment of the present invention includes a speaker lower cover 104 in the form of a case in which a speaker mounting opening 102 is penetratively formed at its upper side surface, and a speaker 12 detachably assembled at the speaker mounting opening 102 of the speaker lower cover 104.

The speaker assembly 100 constructed as such is assembled on a side surface of a intake duct 26 of an intake system 10, preferably to an installation opening 28 formed at a side surface of a section between an inlet of the intake duct 26 through which an intake air is initially introduced and an air cleaner cover 30. The reason is because the possibility of penetration of the foreign materials towards the speaker 12 becomes high if the speaker assembly 100 is installed at the inlet of the intake duct 26 into which the intake air is initially introduced.

Figure 3:
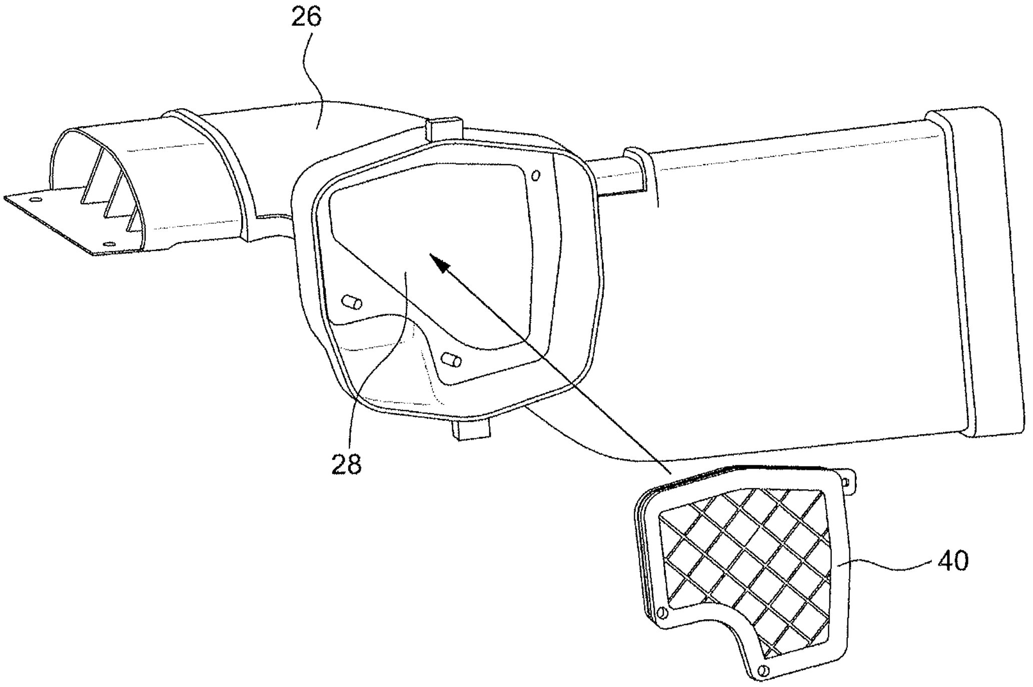
Figure 4:
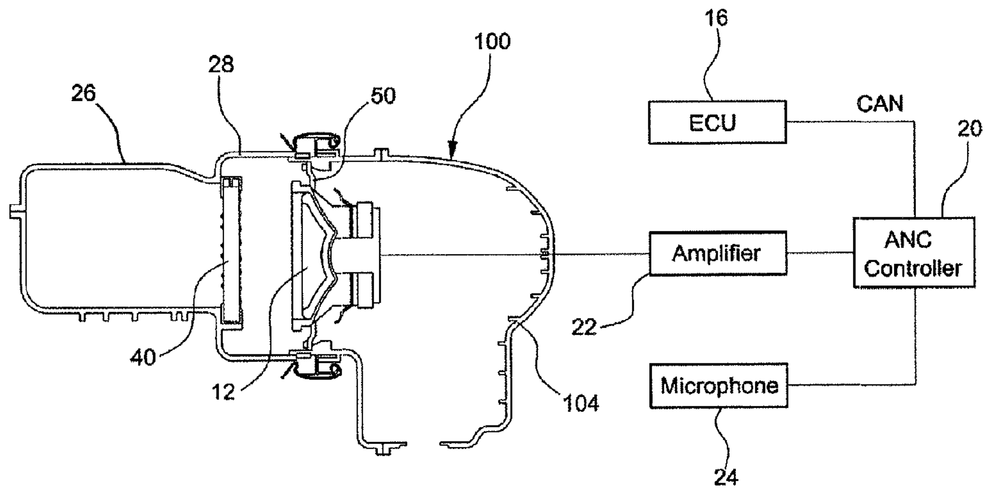

As shown in FIGS. 3 and 4, before installing the speaker assembly 100, a filter 40 which can pass the sound but block the foreign materials is mounted on the installation opening 28 of the intake duct 26.

Next, as shown in FIG. 1, the speaker assembly 100 in which a large size speaker 12 has been assembled at the speaker mounting opening 102 is assembled at the installation opening 28 of the intake duct 26, wherein the peripheral portion of the speaker mounting opening 102 is abutted with the peripheral portion of the installation opening 28 formed at the side surface of the intake duct 26 and joined together using a fastening means such as a clamp, bolt or the like.

At this point, even if the size of a speaker to be assembled in the speaker assembly may be varied depending upon the engines according to kinds of the vehicles or specifications of the speaker, the respective speakers having different sizes can be assembled on the speaker lower cover using an adapter 50.

Figure 2:
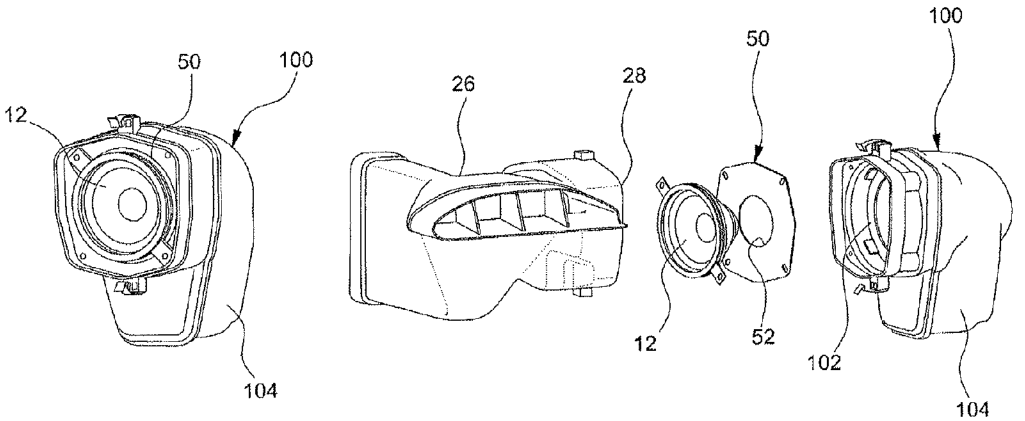

For instance, when a small size speaker 12 needs to be mounted, the adapter 50 in the form of a plate having a mounting hole 52 at its center is provided as shown in FIG. 2. The adapter 50 is vertically arranged at the peripheral portion of the speaker mounting opening 102 of the speaker lower cover 104 and coupled thereto. Then, the rear end of the speaker 12 is inserted into the mounting hole 52 of the adapter 50 and at the same time the peripheral portion of the speaker 12 is closely assembled with the peripheral portion of the adapter 50.

In accordance with one embodiment of the present invention as described in the above, it is possible to install a speaker with different sizes and specifications in a wide range using an adapter, and to easily prevent the penetration of the foreign materials towards the speaker by means of a filter for blocking the foreign materials.

Figure 5:
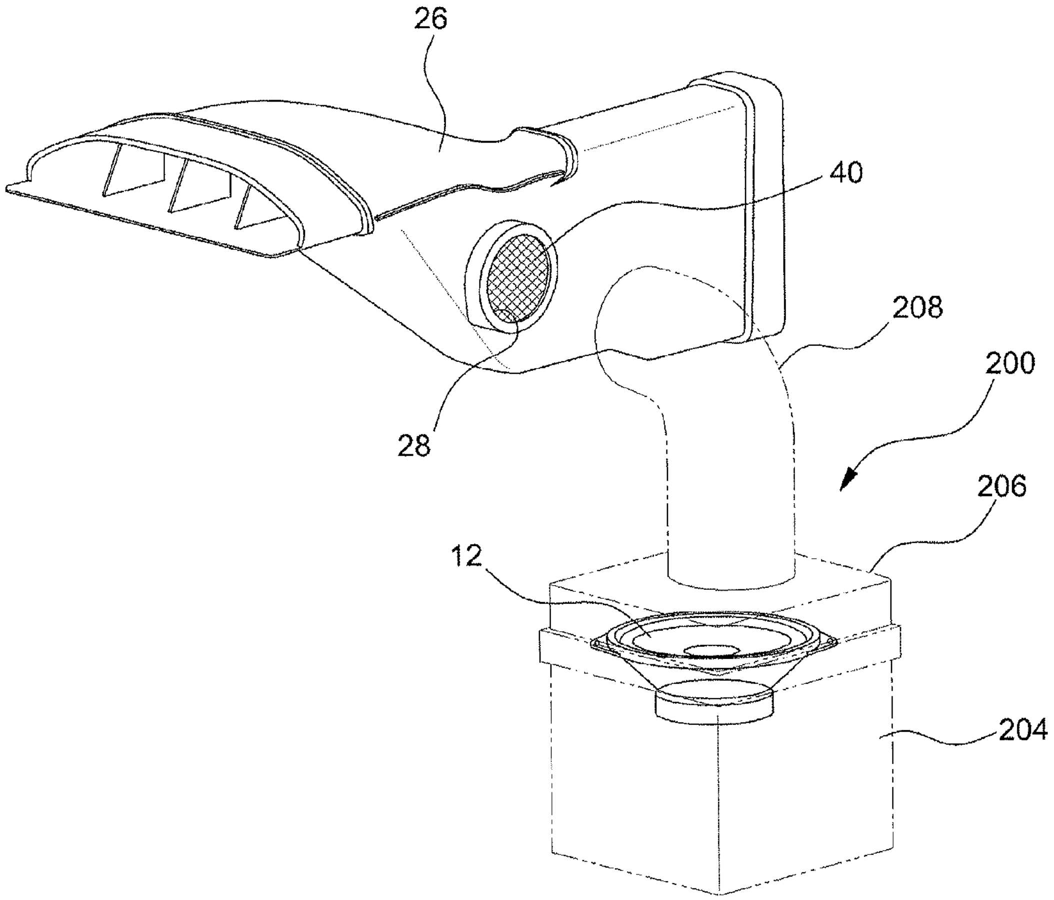
FIGS. 5 and 6 are perspective views illustrating assembling constructions of the speaker assembly of the active noise control apparatus for the intake system of the vehicle in accordance with another embodiment of the present invention.
Figure 6:
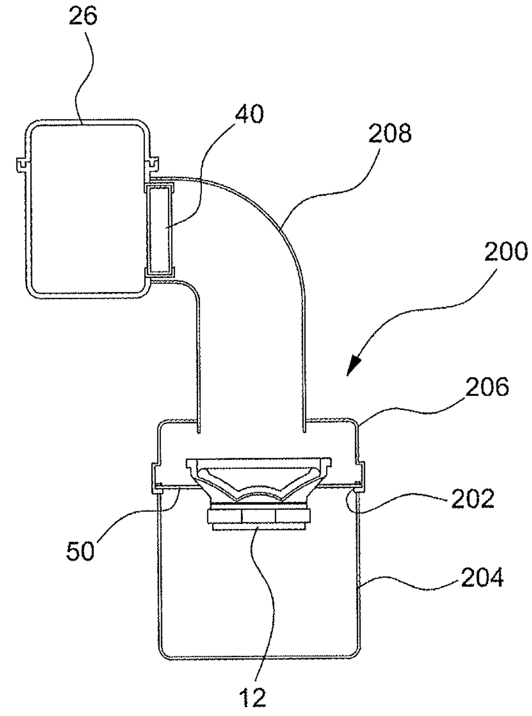

Here, assembling constructions of a speaker assembly of an active noise control apparatus for an intake system of a vehicle in accordance with another embodiment of the present invention will be described with reference to FIGS. 5 and 6 hereinafter.

A speaker assembly 200 in accordance with another embodiment of the present invention includes a speaker lower cover 204 in the form of a case formed with a speaker mounting opening 202 at its upper end portion, a speaker 12 to be assembled at the speaker mounting opening 202 of the speaker lower cover 204, a speaker upper cover 206 coupled to the upper end portion of the speaker lower cover 204 for covering the speaker 12 and the speaker mounting opening 202, and a connector tube 208 in the form of a hollow vertical tube integrally formed on the upper surface of the speaker upper cover 206.

At this moment, the upper end portion of the connector tube 208 is detachably inserted into and coupled with the installation opening 28 formed at the side surface of the intake duct 26 of the intake system 10.

Of course, before installing the speaker assembly 200, a filter 40 which can pass the sound but block the foreign materials is mounted on the installation opening 28 of the intake duct 26, and then the upper end portion of the connector tube 208 is inserted into and coupled with the installation opening 28 to which the filter 40 is mounted, thereby completing the assembling work of the speaker assembly 200 in accordance with another embodiment of the present invention.

Like one embodiment of the present invention, it is possible to assemble a large size speaker 12 to the speaker mounting opening 202 of the speaker lower cover 204, and further a smaller size speaker 12 thereto using the adapter 50.

More particularly, for a large size speaker 12, its peripheral portion is directly assembled on the speaker mounting opening 202 of the speaker lower cover 204. In case of a smaller size speaker 12, the adapter 50 in the form of a plate having the mounting hole 52 at its center is horizontally arranged and coupled with the peripheral portion of the speaker mounting opening 202 of the speaker lower cover 204, and then the rear end of the speaker 12 is inserted into the mounting hole 52 of the adapter 50 and at the same time the peripheral portion of the speaker 12 is closely assembled with the peripheral portion of the adapter 50.

The another embodiment as such can provide advantages in that it is possible to assemble a speaker with different sizes and specifications in a wide range using an adapter and easily prevent the penetration of the foreign materials towards the speaker by use of a filter for blocking the foreign materials.

Figure 7:
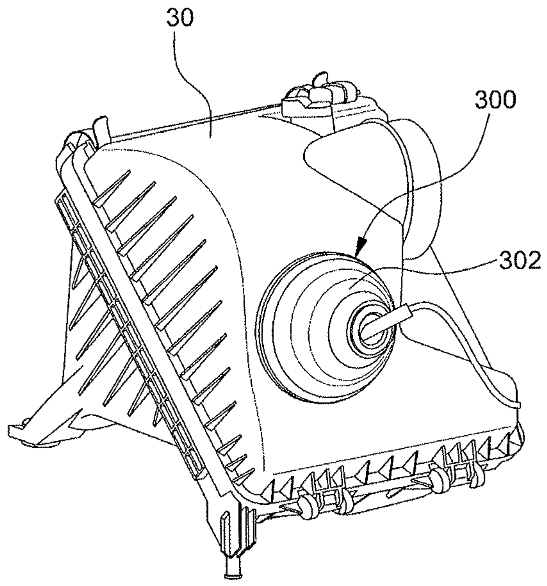
FIGS. 7 and 8 are perspective views illustrating assembling constructions of the speaker assembly of the active noise control apparatus for the intake system of the vehicle in accordance with still another embodiment of the present invention.
Figure 8:
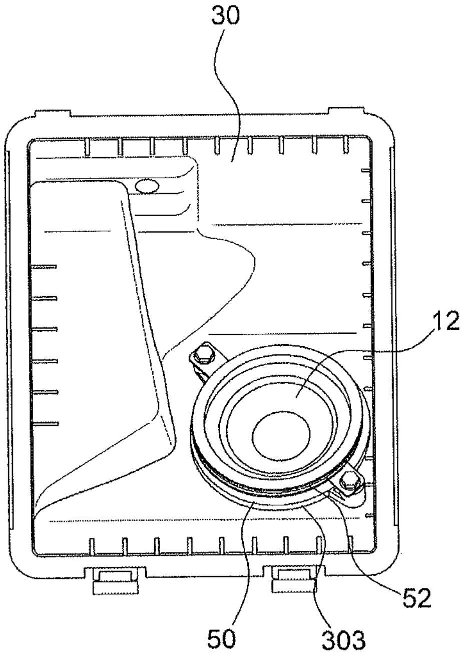
Figure 9:
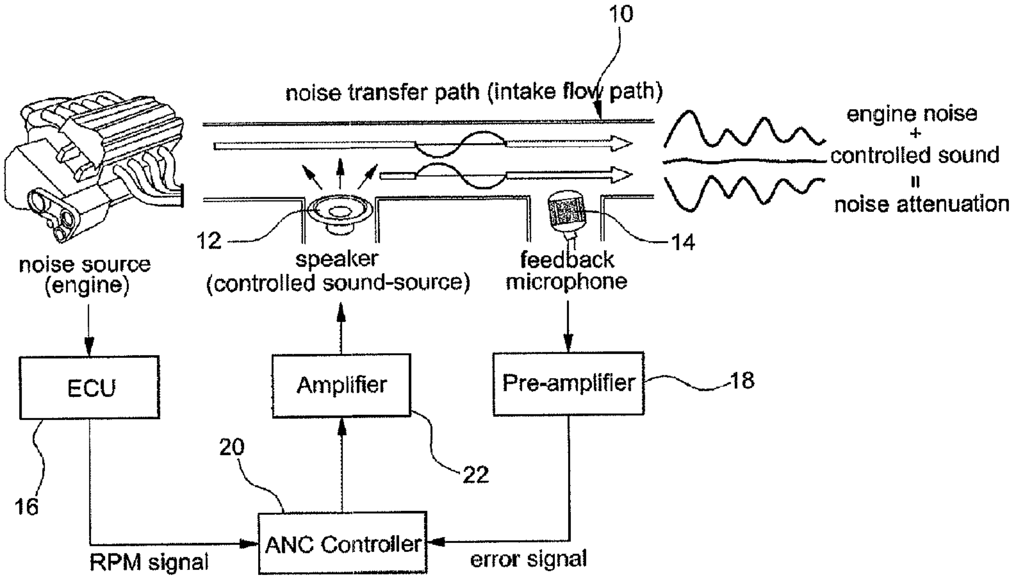
FIG.9 (Related Art)
FIG. 9 is a schematic view illustrating the active noise control technology for the intake system.

Here, assembling constructions of a speaker assembly of an active noise control apparatus for an intake system of a vehicle in accordance with still another embodiment of the present invention will be described with reference to FIGS. 7 and 8 hereinafter.

A speaker assembly in accordance with still another exemplary embodiment of the present invention has features of being assembled on an air cleaner of the intake system.

To this end, the speaker assembly 300 in accordance with still another embodiment of the present invention includes a speaker 12 mounted on the inner surface of an air cleaner cover 30 through a speaker mounting opening 303 formed on the air cleaner cover 30, and a speaker cover 302 disposed on the outer surface of the air cleaner cover 30 for covering the rear portion of the speaker 12.

At this point, since the inside of an air cleaner to which the speaker assembly 300 is assembled has been maintained in a clean state, it is possible to mount only the speaker assembly 300 excluding the separate filter for blocking the foreign materials.

As a configuration for selectively mounting a different sized speaker 12, between the speaker 12 and the speaker cover 302, an adapter 50 with a mounting hole 52 at its center is further assembled thereto.

In more detail, for a large size speaker 12, its peripheral portion is directly assembled on the peripheral portion of the speaker cover 302. In the case of a smaller size speaker 12, the adapter 50 in the form of a plate having the mounting hole 52 at its center is coupled with the peripheral portion of the speaker cover 302, and then the rear end of the speaker 12 is inserted into the mounting hole 52 of the adapter 50 and at the same time the peripheral portion of the speaker 12 is closely assembled with the peripheral portion of the adapter 50.

It can be appreciated that the still another embodiment as such can provide advantages in that it is possible to assemble a speaker with different sizes and specifications in a wide range using an adapter, and prevent the penetration of the foreign materials towards the speaker without assembling a filter for blocking the foreign materials since the speaker is disposed within an air cleaner in a clean state.

Meanwhile, an amplifier 22 is connected to the speaker of the respective embodiments described in the above, and an ANC controller 20, which receives an RPM signal from an engine ECU 16 and simultaneously applies a control signal to the amplifier 22 after receiving an error signal for compensating the sound of a microphone 24, is connected to the amplifier 22.

Accordingly, when the ANC controller 20 receives the RPM signal from the engine ECU 16 and simultaneously receives the error signal for compensating the sound of the microphone 24 and applies a controlled sound-source signal to the amplifier 22, the controlled sound-source is transferred from the amplifier 22 to the speaker 12 and at the same time the controlled sound-source is outputted from the speaker 12 into the intake system 10, thereby attenuating and tuning the engine noise discharged into the intake system.

For convenience in explanation and accurate definition in the appended claims, the terms "upper", "lower", "inner" and "outer" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. An active noise control apparatus for an intake system of a vehicle, comprising:

an intake duct;

an installation opening branched from a side surface of the intake duct;

a filter mounted on a first end portion of the installation opening for blocking foreign materials wherein the first end portion is a portion mounted to the side surface of the intake duct;

a speaker assembly detachably installed at a second end portion of the installation opening;

wherein the speaker assembly includes a speaker lower cover formed with a speaker mounting opening at an upper side surface thereof; and a speaker assembled at the speaker mounting opening of the speaker lower cover;

wherein an outer peripheral portion of the speaker mounting opening is assembled on the second end portion of the installation opening.

2. The apparatus of claim 1, wherein an adapter having a mounting hole at the center thereof is assembled at the outer peripheral portion of the speaker mounting opening.

3. The apparatus of claim 1, wherein the speaker assembly comprises:

the speaker lower cover formed with the speaker mounting opening at an upper end portion thereof;

the speaker assembled at the speaker mounting opening of the speaker lower cover;

a speaker upper cover coupled to the upper end portion of the speaker lower cover for covering the speaker mounting opening therein; and a connector tube integrally formed on an upper surface of the speaker upper cover;

wherein an upper end portion of the connector tube is detachably assembled on the installation opening.

4. The apparatus of claim 3, wherein the filter is disposed at the upper end portion of the connector tube.

5. The apparatus of claim 1, wherein the speaker assembly comprises:

the speaker mounted on an inner surface of an air cleaner cover in the intake system; and a speaker cover disposed at an outer surface of the air cleaner cover for covering a rear portion of the speaker.

6. The apparatus of claim 5, wherein the speaker is mounted on the inner surface of the air cleaner cover through a speaker mounting opening formed to the air cleaner cover.

7. The apparatus of claim 5, wherein an adapter having a mounting hole at the center thereof is further assembled to the speaker mounting opening between the speaker and the speaker cover.

* * * * *